Figure 1:
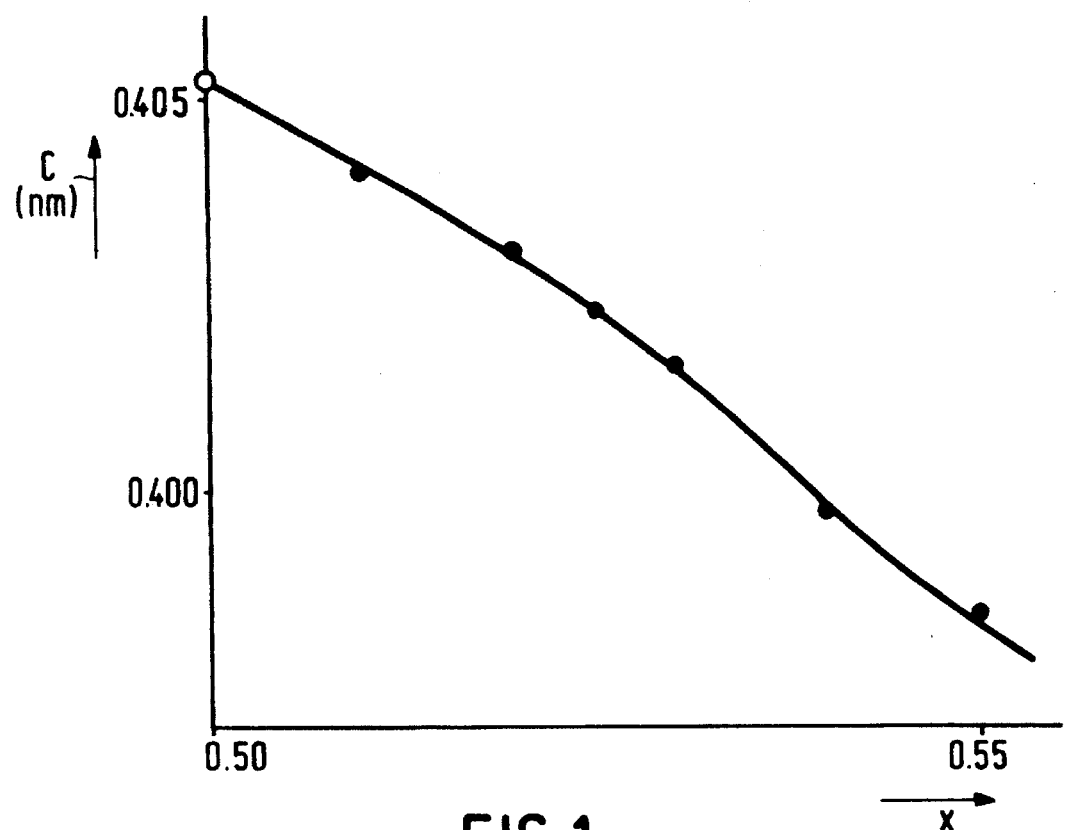

United States Patent [19]

Ouwerkerk

[11] Patent Number: 5,562,768
[45] Date of Patent: Oct. 8, 1996

[54] POTASSIUM-LITHIUM NIOBATE CRYSTALS

[75] Inventor: Martin Ouwerkerk, Eindhoven, Netherlands

[73] Assignee: U.S. Philips Corporation, New York, N.Y.

[21] Appl. No.: 807,407

[22] Filed: Dec. 12, 1991

Related U.S. Application Data

[63] Continuation of Ser. No. 505,735, Apr. 5, 1990, abandoned.

[30] Foreign Application Priority Data

Jul. 20, 1989 [NL] Netherlands ................ 8901875

[51] Int. Cl.$^6$ ................................................. C30B 29/30
[52] U.S. Cl. .......................... 117/78; 117/73; 117/948; 423/596
[58] Field of Search ................ 372/34; 423/596; 186/600, 621, 622, 624, DIG. 71, DIG. 87; 117/73, 78, 948

[56] References Cited

FOREIGN PATENT DOCUMENTS 49-11319   3/1974   Japan ...................... 156/600

OTHER PUBLICATIONS

Adachi et al. (I), "$K_3Li_2Nb_5O_{15}$ Optical Waveguides Fabricated on Sapphire by RF Sputtering," Jpn. J. Appl. Phys. vol. 18 (1979), No. 8 pp. 1637–1638.

Adachi et al., (II) "Elastic and Piezoelectric Properties of Potassium Lithium Niobate Crystals", Jap. J. Appl. Phys. vol. 17 (No. 11) Nov. 1978 pp. 1969–1973.

Neurgaonkar et al. "Growth and Properties of Tungsten Bronze $K_3Li_2Nb_5O_{15}$ Sangle Crystals", Mat. Res. Bull. vol. 24 pp. 1025–1030, 1989.

Kazaryan "Study of the Growth Conditions of Potassium Lithium Niobate Crystals in Ferroelectric Phase", Isv. Aked. Nouk. Arm, vol. 13(3) pp. 241–243, 1978, abs. only.

Fukuda, "Growth and Crystaliographic Characteristics of $K_3L_2Nb_5O_{15}$ Single Crystals", Japan J. Appl. Phys. 8(1969) pp. 122.

*Primary Examiner*—Robert Kunemund
*Attorney, Agent, or Firm*—Norman N. Spain

[57] ABSTRACT

The invention provides a method of manufacturing stoichiometric potassium-lithium niobate crystals. Such crystals exhibit a high degree of double refraction and can suitably be used to double the frequency of a light wave with noncritical phase matching. By virtue of the temperature dependence of the nonlinear optical properties and the possibility of doubling the frequency at room temperature and at wavelengths from 800 to 850 nm the material according to the invention is very suitable for use in cooperation with semiconductor lasers.

4 Claims, 1 Drawing Sheet

POTASSIUM-LITHIUM NIOBATE CRYSTALS

This is a continuation of application Ser. No. 07/505,735, filed Apr. 5, 1990, now abandoned.

The invention relates to potassium-lithium niobate crystals and to a method of manufacturing such crystals.

The invention also relates to a device for doubling the frequency of a light wave, in which a fundamental light wave is passed through a nonlinear optical medium so as to form a second-harmonic wave.

Potassium-lithium niobate $(K_2O)_{0.3}(Li_2O)_{0.7-x}(Nb_2O_5)_x$ having a tetragonal crystal structure with x having a value in the range from 0.515 to 0.55, is described in an article by A. W. Smith et. al. in J. Appl. Phys. 42 (2), pages 684 to 686 (1971). Said article also describes an application in which frequency-doubling of the light of an Nd:YAG laser is attained. In the opinion of the Applicants, potassium-lithium niobate has not been used on a large scale for this purpose, because the nonlinear optical properties are highly temperature-dependent, as a consequence of which a proper adaptation to the Nd:YAG laser is difficult to achieve. For applications in which a (much weaker) semiconductor laser is used, the light output is generally insufficient because the efficiency of frequency-doubling is quadratically proportional to the intensity of the incident light beam.

In an article by B. A. Scott et. al., in Mat. Res. Bull. 5 (1), pages 47 to 56 (1970) a description is given of the phase diagram of the system $K_2O$—$Li_2O$—$Nb_2O_5$, from which it could be derived that stoichiometric $K_3Li_2Nb_5O_{15}$ does not exist in a crystalline form. In an article by W. A. Bonner et. al., in J. Crystal Growth 1, pages 318 to 319 (1967) a description is given of a method of manufacturing potassium-lithium niobate according to the Czochralski method on the basis of potassium carbonate, lithium carbonate and niobium pentoxide, the material manufactured allegedly being nominally stoichiometric. However, the determination of the length of the c-axis of the crystal structure (0.397 m) indicates that the niobium-pentoxide content is approximately 55 mol %, see the above-mentioned article by Scott et. al.

It is an object of the invention to provide a nonlinear optical material and a method of manufacturing such a material, which material enables frequency-doubling with non-critical phase matching. A particular object of the invention is to enable frequency-doubling at room temperature at wavelengths of approximately 800 nm. It is desirable to provide a material having a high degree of double refraction, so that phase matching of the infrared or red (fundamental light wave) and blue (second harmonic wave) light is possible to prevent extinction of the light. A further object of the invention is to provide a simple and accurate method of manufacturing potassium-lithium niobate crystals.

A still further object of the invention is to provide a device by means of which frequency-doubling can be attained. In this connection, one of the objects of the invention is to enable frequency-doubling (halving the wavelength) of light from a semiconductor laser, for example, for the purpose of telecommunication by means of glass fibres and optical storage of information. When light of a short wavelength is used, the information density can be increased and the possibilities of writing and erasing information are also increased.

According to the invention, these objects are achieved by a method in which stoichiometric potassium-lithium niobate is manufactured according to the formula

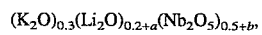

wherein $-0.01<a<0.01$ and $-0.01<b<0.01$. The material manufactured according to the invention is almost completely stoichiometric, within the limits of accuracy with which the composition can be determined. Small variations in the composition, as indicated by the values a and b, are permissible without the favourable properties of the material being adversely affected. It has been found that in this material, which exhibits a tetragonal crystal structure, the length of the c-axis of the unit cell is up to 0.4052 nm. Probably, this contributes to the double refraction being larger than in other potassium-lithium niobate crystals having a non-stoichiometric composition.

In a suitable embodiment of the method according to the invention, the crystals are manufactured by cooling a melt whose composition is selected such that the atomic quantities of the metal ions are in the following ratios:

30 mol % K, 27 mol % Li and 43 mol % Nb.

The said metals can be fused, for example, in known manner, in the form of oxides or carbonates. The customary application of lithium carbonate, see for example the above-mentioned articles by B. A. Scott et. al. and W. A. Bonner et. al., however, leads to inaccuracies in the composition due to the large volatility of lithium carbonate and the melting temperature of the mixture. In a particularly advantageous embodiment of the method according to the invention, in which particularly the quantity of lithium can be accurately measured, Li in the form of $LiNbO_3$ is used for the manufacture of the melt.

To obtain a satisfactory yield, it is efficacious for the cooling rate of the melt in the temperature range from 1050° to 900° C. to be less than 1° C./hr.

According to the invention, the object of providing a device for doubling the frequency of a light wave is achieved by a device as described in the opening paragraph, in which the fundamental light wave is generated by a semiconductor laser and the nonlinear optical medium is formed from a stoichiometric potassium-lithium niobate crystal according to the formula:

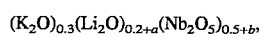

wherein $-0.01<a<0.01$ and $-0.005<b<0.005$.

The nonlinear optical medium according to the invention is very suitable for such an application in cooperation with a semiconductor laser because the temperature dependence of the wavelength of the light emitted by the laser and the temperature dependence of the wavelength at which phase-matched frequency-doubling occurs are substantially equal. By virtue hereof, the cooperating of semiconductor laser and nonlinear optical medium can remain adapted to each other over a wide temperature range without further measures being taken. A sufficient light output can be obtained, in particular, when the nonlinear optical medium is used in the form of a waveguide, for example, in the form of a planar waveguide.

Figure 2:
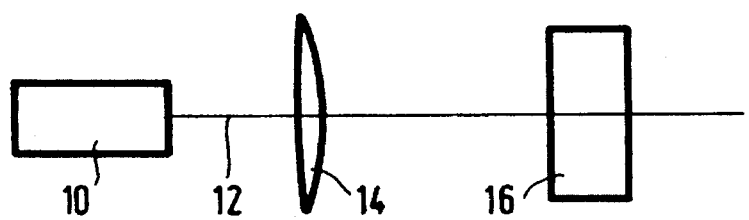
Figure 3:
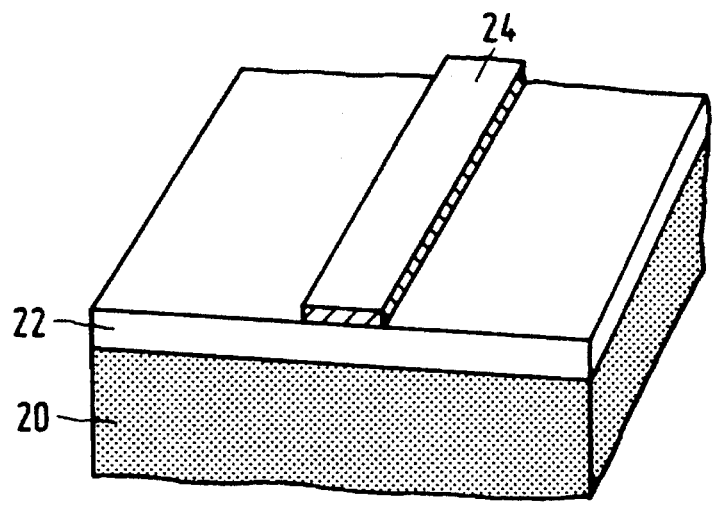

Exemplary embodiments of the method and the device according to the invention are explained with reference to the accompanying drawings, in which FIG. 1 shows the relation between the composition of potassium-lithium niobate $(K_2O)_{0.3}(Li_2O)_{0.7-x}(Nb_2O_5)_x$ and the length of the c-axis of the crystalline unit cell, FIG. 2 diagrammatically shows a device according to the invention, and FIG. 3 diagrammatically shows a part of an alternative embodiment of a device according to the invention.

EXEMPLARY EMBODIMENT 1.

319.0 g of niobium pentoxide $Nb_2O_5$, 311.0 g of potassium carbonate $K_2CO_3$ and 598.8 g of lithium niobate $LiNbO_3$ were combined and fused by heating to 1200° C. at a rate of 250° C./hr. The molar composition of the melt on the basis of the oxides was: 43 mol % of $Nb_2O_5$, 30 mol % of $K_2O$ and 27 mol % of $Li_2O$. By virtue of the high melting point of $LiNbO_3$ (1230° C.) there was no loss of Li as a consequence of evaporation. The specific weight of the melt was 4.4 $g/cm^3$, the volume was 256 ml The melt was manufactured in a Pt/Au crucible having a volume of 700 ml.

The melt was cooled at a rate of 60° C./hr to 1050° C., at a rate of 1° C./hr to 800° C. and at a rate of 5° C./hr to room temperature. The furnace used has a very stable temperature and can be adjusted with an accuracy of 0.04° C. A light yellow crystal was formed at the end of a wire of Pt/Au at a temperature of 980° C. Approximately 1 to 2% of the melt was converted to a potassium-lithium niobate crystal. The crystals were cooled slowly to room temperature to prevent cracking. By means of X-ray diffraction it was established that the crystals exhibit a tetragonal structure, with a length of the a-axis of 1.2558 nm and a length of the c-axis of 0.4052 nm. The composition is stoichiometric, within the limits of accuracy with which the composition can be determined: potassium 3.00±0.03, lithium 1.99±0.02, niobium 5.01±0.05 and oxygen 15.03.

FIG. 1 shows the relation between the composition of the potassium-lithium niobate $(K_2O)_{0.3}(Li_2O)_{0.7-x}(Nb_2O_5)_x$ for values of x from 0.50 to 0.55, and the length of the c-axis of the crystalline unit cell. Apart from the value for x=0.50 of the material according to the invention, the data are taken from the above-mentioned publication by B. A. Scott et. al.

The material manufactured according to the invention is resistant to a constant radiation load of 200 $MW/cm^2$ at a wavelength of 488 nm. A value of 10 $MW/cm^2$ is already sufficient to apply a fundamental light wave having an intensity of 100 mW in a light conductor having a cross-section of 2×2 $\mu m^2$. This is sufficient for useful applications concerning frequency-doubling having a yield of approximately 1%.

For applications concerning frequency-doubling of light having a wavelength of approximately 800 nm, it is further important that the material is transparent at wavelengths from 360 to 1000 nm, so that the second harmonic wave is not absorbed.

The material according to the invention is not hygroscopic and is resistant to sulphuric acid, hydrochloric acid, nitric acid and (10%) hydrofluoric acid.

Exemplary embodiment 2.

A potassium-lithium niobate crystal manufactured according to exemplary embodiment 1 and having the following dimensions 2.5×2.5×0.5 $mm^3$, was provided with two plane parallel windows by means of polishing. The orientation of the crystal was selected such that the c-axis of the crystal structure extends in the plane of the windows.

FIG. 2 shows a laser-light source 10, for example a semiconductor laser such as a GaAs laser or a AlGaAs laser, by means of which a light wave 12 having a maximum intensity of 100 mW was generated. The light wave was focused on a window on the potassium-lithium niobate crystal 16 by means of a lens 14. The cross-section of the light beam at the location of the crystal was 1.22×$10^{-5}$ $cm^2$, the angle of aperture of the light beam was smaller than 2°. In a number of the experiments described herein, a Kr laser and a "tunable dye laser" were used in order to carry out wavelength-dependent measurements. The light wave 12 was polarized in a direction perpendicular to the c-axis of the crystal by means of a polarization filter which is not shown in this drawing. In addition, means were used which enabled the intensity of the fundamental light wave to be adjusted to any desirable value and the results obtained to be measured.

The second harmonic wave generated is parallel to the fundamental light wave and polarized in a direction which is parallel to the c-axis of the crystal structure. The intensity of the second harmonic wave is proportional to the square of the intensity of the fundamental light wave. At 70 mW intensity of the incident light, the intensity of the blue light generated is 380 nW. As the nonlinear optical medium according to the invention enables non-critical phase matching, a relatively large deviation of the angle of incidence of the fundamental lightwave is permissible. A variation in the angle of incidence of maximally 5° leads to a displacement of less than 1 nm of the wavelength at which frequency-doubling is optimal.

The frequency-doubling is optimal at room temperature at a wavelength of the fundamental light wave of 803 nm. The spectral width at half the maximum value is 1.6 nm. The temperature dependence of the optimum value of the wavelength is 0.28 nm/°C. in the temperature range from 20° to 80° C. This matches very well with the temperature dependence of approximately 0.3 nm/°C. of the wavelength of the light produced the multimode GaAs and AlGaAs semiconductor lasers.

The nonlinear coefficient $d_{31}$ in the second order susceptibility tensor is a measure of the efficiency of the frequency-doubling. In the nonlinear optical medium according to the invention, $d_{31}$ is 13±2 pm/V. For comparison: in the case of a potassium-lithium niobate crystal according to the state of the art, with x=0.53, $d_{31}$ is only 6 pm/V.

The ordinary refractive index $n_o$ at 803 nm and at room temperature is 2.23. The extraordinary refractive index $n_e$ is 2.09 under similar conditions. When the wavelength is halved to 401.5 nm, $n_e$ is 2.23, so that at these wavelengths phase matching of the fundamental and the second harmonic lightwave is possible at a "walk off angle" of 0°.

At a wavelength of 632 nm and at room temperature, $n_o$=2.28 and $n_e$=2.11. These values indicate that the double-refractive character of the material according to the invention has increased relative to the values indicated by A. W. Smith et. al. in the above-mentioned article, said values being $n_o$=2.28 and $n_e$=2.13, in a potassium-lithium niobate crystal with x=0.52.

Exemplary embodiment 3.

A device for doubling the frequency of a light wave having a high yield can be obtained by using the nonlinear optical medium according to the invention in a resonant optical cavity or in an optical waveguide. For this purpose, the potassium-lithium niobate may be manufactured in the form of a powder with which epitaxial layers can be manufactured by means of rf-sputtering or laser ablation. FIG. 3 shows a part of a device for doubling the frequency of a light wave, which device is composed of a substrate 20, for example of sapphire, on which a monocrystalline layer 22 having a low refractive index is deposited. Said layer carries an epitaxially grown layer 24 of potassium-lithium niobate in which structures of any desirable shape can be formed by means of (photo)lithography and etching. An epitaxial coating layer (not shown in the drawing) having a low refractive index is provided thereon.

When a waveguide having a cross-section of 5×5 $\mu m^2$ is used, a length of 2 mm is sufficient to obtain a second harmonic wave having an intensity of 1 mW when a fundamental light wave having an intensity of 100 mW is used. It is necessary to use a monomode laser because in this construction the spectral width over which frequency-doubling takes place is approximately 0.4 nm.

I claim:

1. A method of manufacturing potassium-lithium niobate crystals having a composition of the formula $(K_2O)_{0.3}(Li_2O)_{0.2+a}(Nb_2O_5)_{0.5+b}$ wherein $-0.01<a<0.01$ and $-0.005<b<0.005$ and with a c-axis of about 0.405 nm comprising cooling a melt the composition of which contains K, Li and Nb in the following atomic ratio:

30 atomic % of K, 27 atomic % of Li and 43 atomic % of Nb.

2. A method as claimed in claim 1, characterized in that Li in the form of $LiNbO_3$ is used to manufacture the melt.

3. A method as claimed in claim 1, characterized in that the cooling rate of the melt in the temperature range from 1050° to 900° C. is less than 1° C./hr.

4. A device for doubling the frequency of a light wave, in which a fundamental light wave is passed through a nonlinear optical medium so as to form a second harmonic wave, characterized in that the fundamental light wave is generated by a semiconductor laser and the nonlinear optical medium is formed from a stoichiometric potassium-lithium niobate crystal according to the formula $(K_2O)_{0.3}(Li_2O)_{0.2+a}(Nb_2O_5)_{0.5+b}$ wherein $-0.01<a<0.01$ and $-0.005<b<0.005$ and with a c-axis of about 0.405 nm.

* * * * *